(12) United States Patent
Wu et al.

(10) Patent No.: US 7,916,212 B2
(45) Date of Patent: Mar. 29, 2011

(54) IMAGE SENSOR PACKAGE AND CAMERA MODULE UTILIZING THE SAME

(75) Inventors: Ying-Cheng Wu, Taipei Hsien (TW); Te-Chun Chou, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 387 days.

(21) Appl. No.: 12/210,534

(22) Filed: Sep. 15, 2008

(65) Prior Publication Data

US 2009/0284628 A1 Nov. 19, 2009

(30) Foreign Application Priority Data

May 16, 2008 (CN) .......................... 2008 1 0301615

(51) Int. Cl.
*H04N 5/225* (2006.01)
*H01L 31/0203* (2006.01)
(52) U.S. Cl. ........................................ 348/374; 257/434
(58) Field of Classification Search ............... 250/208.1, 250/239; 257/434, 680, 294; 348/294, 374; 438/65
See application file for complete search history.

(56) References Cited

U.S. PATENT DOCUMENTS

| | | | |
|---|---|---|---|
| 2005/0056769 A1* | 3/2005 | Chen | 250/208.1 |
| 2005/0139848 A1 | 6/2005 | Yee | |
| 2006/0044433 A1* | 3/2006 | Akram | 348/294 |
| 2006/0086890 A1* | 4/2006 | Chao et al. | 250/208.1 |
| 2006/0086899 A1* | 4/2006 | Chao et al. | 250/239 |
| 2006/0151847 A1* | 7/2006 | Kwon et al. | 257/433 |
| 2006/0170086 A1* | 8/2006 | Song et al. | 257/678 |
| 2006/0171698 A1* | 8/2006 | Ryu et al. | 348/294 |
| 2006/0219862 A1 | 10/2006 | Ho et al. | |
| 2006/0231750 A1* | 10/2006 | Chao et al. | 250/239 |
| 2006/0284215 A1 | 12/2006 | Maeda et al. | |
| 2007/0029582 A1* | 2/2007 | Minamio et al. | 257/234 |

\* cited by examiner

*Primary Examiner* — Jason Whipkey
(74) *Attorney, Agent, or Firm* — Clifford O. Chi

(57) ABSTRACT

An image sensor package includes an image sensor chip, a sidewall, an encapsulation glass, conductive material, and a plurality of solder balls. The image sensor chip comprises a photosensitive area, a non-photosensitive area surrounding the photosensitive area, and a plurality of bonding pads formed on the non-photosensitive area. The sidewall is located on the non-photosensitive are and defines a plurality of first through holes aligned with and corresponding to the bonding pads. The encapsulation glass is located on the sidewall. A plurality of solder balls are formed on the encapsulation glass aligned with the bonding pads, respectively. The encapsulation glass defines a plurality of second through holes each corresponding to a bonding pad and a corresponding solder ball. The image sensor package further comprises a conductive material through which the first and second through holes penetrate.

17 Claims, 4 Drawing Sheets

IMAGE SENSOR PACKAGE AND CAMERA MODULE UTILIZING THE SAME

BACKGROUND

1. Technical Field

The disclosure relates to semiconductor packages and, particularly, to an image sensor package and a camera module utilizing the same.

2. Description of the Related Art

Current image sensor packages typically include an image sensor chip, a substrate, a number of gold wires, and an encapsulation glass. The image sensor chip is located on the substrate and electrically connected to the substrate via the gold wires. The encapsulation glass encapsulates the image sensor chip and the gold wires. These image sensor packages tend to have undesirably bulky structures since a substantial substrate footprint is required for wire bonding.

What is needed, therefore, is an image sensor package and camera module utilizing the same, which can overcome the described limitations.

BRIEF DESCRIPTION OF THE DRAWINGS

Many aspects of the disclosed image sensor package and camera module should be better understood with references to the accompanying drawings. The components in the drawings are not necessarily drawn to scale, the emphasis instead being placed upon clearly illustrating the principles of the present image sensor package and camera module. Moreover, in the drawings, like reference numerals designate corresponding parts throughout the several views.

DETAILED DESCRIPTION

Embodiments of the present image sensor package and camera module utilizing the same will now be described in detail with references to the drawings.

Figure 1:
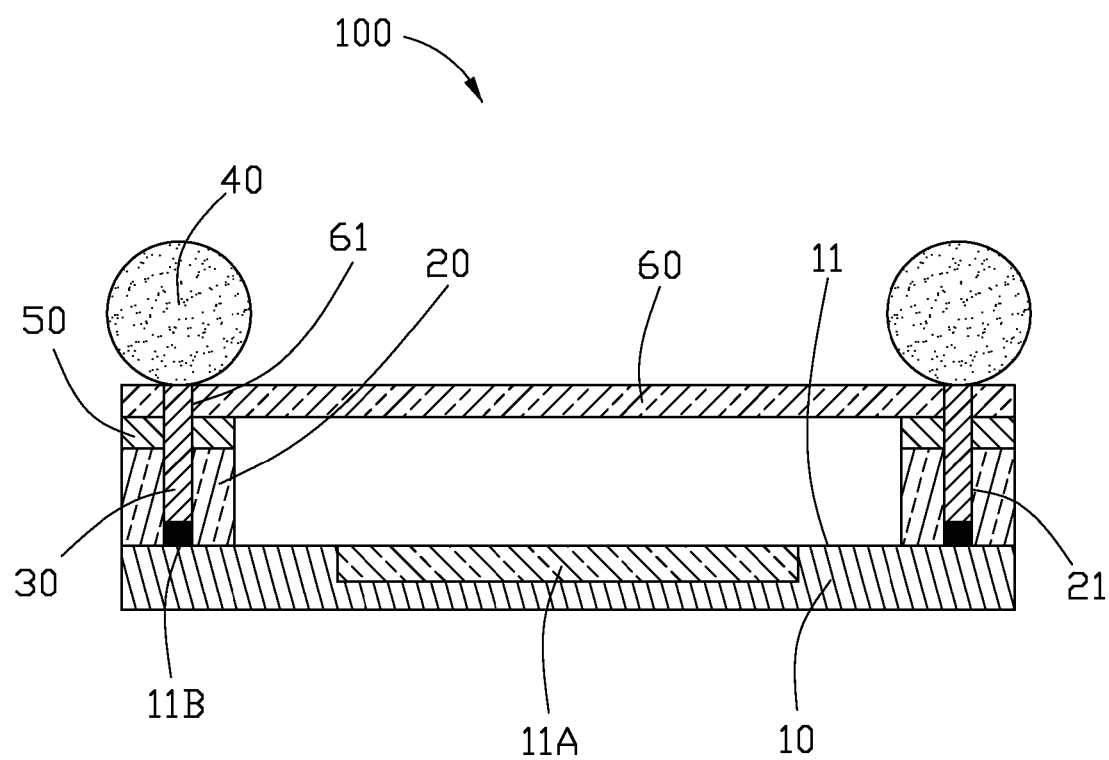
FIG. 1 is a schematic cross section of an image sensor package, according to a first exemplary embodiment.

Referring to FIG. 1, an image sensor package 100, according to an exemplary embodiment, includes an image sensor chip 10, a sidewall 20, an adhesive layer 50, an encapsulation glass 60, a conductive material 30, and two solder balls 40.

The image sensor chip 10 includes a photosensitive area 11A and a non-photosensitive area 11. The non-photosensitive area 11 surrounds the photosensitive area 11A and has two bonding pads 11B formed thereon.

The sidewall 20 is made of an insulative light-impervious material. The sidewall 20 is located on the non-photosensitive area 11 surrounding the photosensitive area 11A of the image sensor 10, and covers the two bonding pads 11B. The sidewall 20 also defines two first through holes 21 aligned with and corresponding to the two bonding pads 11B.

The encapsulation glass 60, such as an infrared cut filter, is fixed on the sidewall 20 via the adhesive layer 50 and is configured for preventing the photosensitive area 11A of the image sensor chip10 from staining while blocking infrared light. The encapsulation glass 60 and the adhesive layer 50 define two second through holes 61. The two second through holes 61 correspond to the two first through holes 21, respectively.

The two solder balls 40 are located on the encapsulation glass 60, aligned with the two second through holes, respectively. As a result, the two second through holes 61 also correspond to the two solder balls 40.

The conductive material 30 is filled with the corresponding first and second through holes 21, 61 to electrically interconnect the bonding pads 11B and the solder balls 40. The conductive material 30 is copper.

The number of bonding pads 11B, the first through holes 21, the second through holes 61, and the solder balls 40 is not limited by this embodiment, but can be configured depending on requirements. In alternative embodiments, the number of the bonding pads 11B, the first through holes 21, the second through holes 61, and the solder balls 40 can be one or more.

Figure 2:
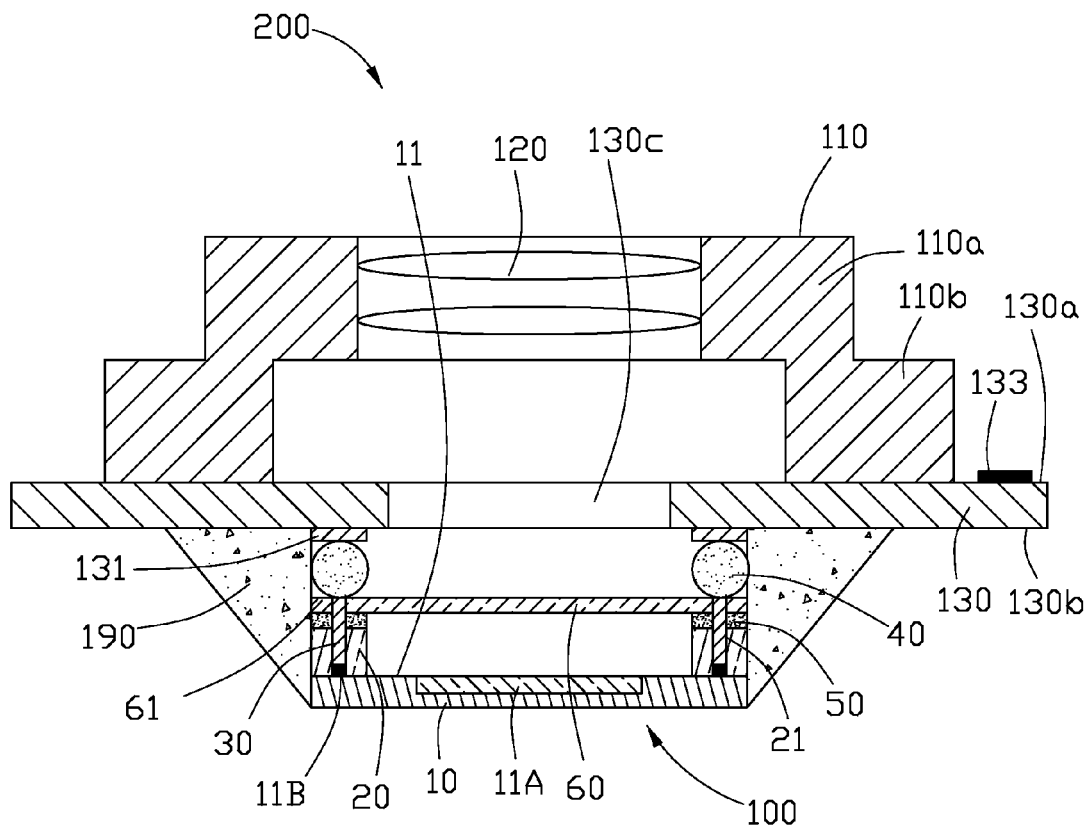
FIG. 2 is a schematic cross section of a camera module, according to a second exemplary embodiment.

Referring to FIG. 2, a camera module 200 utilizing the image sensor package 100 of the second exemplary embodiment is disclosed. The camera module 200 includes the image sensor package 100, a lens holder 110, two lenses 120, and a circuitized board 130.

The lens holder 110 comprises a hollow first portion 110a and a hollow second portion 110b coaxially aligned with the hollow first portion 110a. The hollow first portion 110a is smaller than the hollow second portion 110b. The two lenses 120 are received in the first hollow portion 110a of the lens holder 110.

The circuitized board 130 includes a first connecting surface 130a and a second connecting surface 130b facing away from the first connecting surface 130a. The lens holder 110 is located on the first connecting surface 130a. In this embodiment, the first connecting surface 130a is larger than the cross-section of the second hollow portion 110b. A number of second base pads 133 are formed on the exposed portion of the first connecting surface 130a (uncovered by the second hollow portion 110b) for electrically communicating with external circuit(s) (not shown). Two first base pads 131 are located on second connecting surface 130b of the circuitized board 130. Each of the first base pads 131 is electrically connected to a corresponding solder ball 40 to electrically connect the image sensor chip 10 to the circuitized board 130. The circuitized board 130 defines a circular through opening 130c coaxially aligned with the lens holder 110. The through opening 130c is larger than or to the same size as the photosensitive area 11A of the image sensor chip 10 to allow light transmitted from the lenses 120 therethrough to the entire photosensitive area 11A.

Advantageously, the camera module 200 further includes an encapsulation epoxy 190 located on the periphery of the image sensor package 100 to firmly attach the image sensor package 100 to the second connecting surface 130b of the circuitized board 130.

Figure 3:
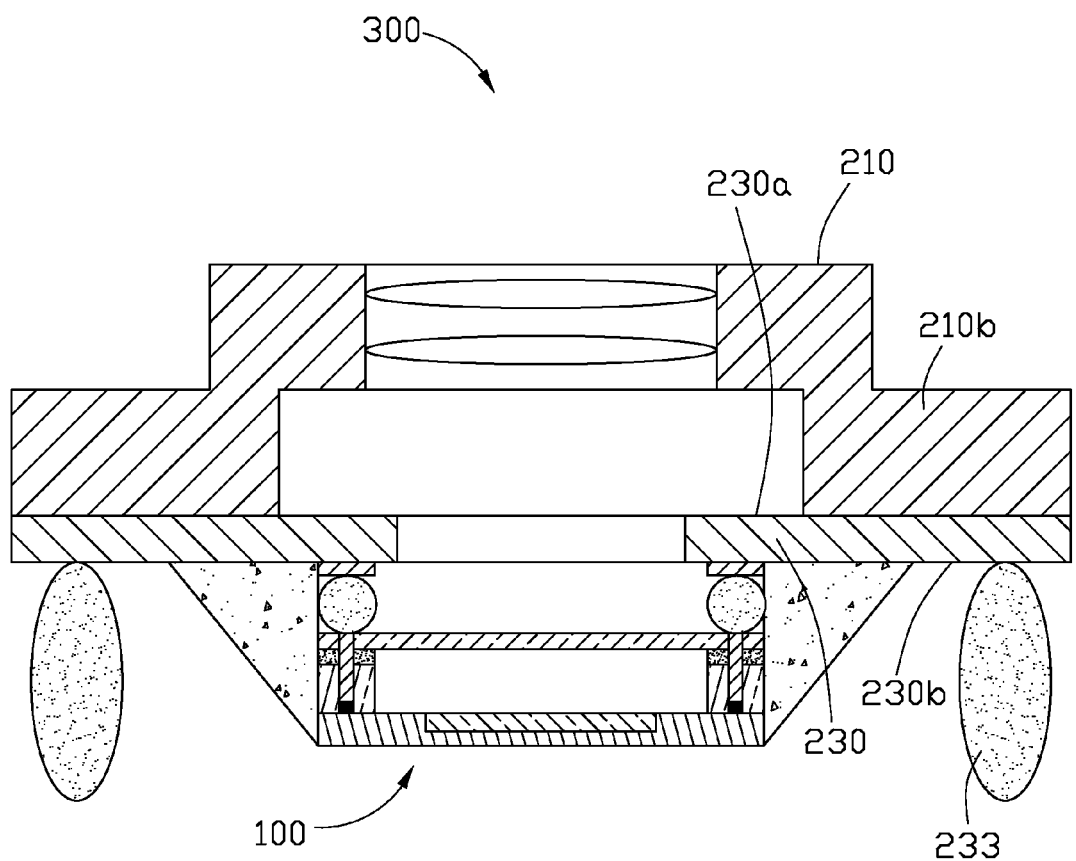
FIG. 3 is a schematic cross section of a camera module, according to a third exemplary embodiment.

Referring to FIG. 3, a camera module 300 in accordance with a third exemplary embodiment is disclosed, differing from the camera module 200 only in the presence of a number of solder bumps 233 formed on the circuitized board 230. In this embodiment, the first connecting surface 230a of the circuitized board 230 is substantially equal to the size of the cross-section of the second hollow portion 210b of the lens holder 210. Specifically, the entire first connecting surface 130a is covered by the second hollow portion 210b. A number of solder bumps 233 are thus employed in this embodiment rather than the second base pads, formed on the periphery of the second connecting surface 230b. The height of the solder bumps 233 exceeds that of the image sensor package 100, allowing mechanical and electrical coupling of camera module 300 to external circuit(s) (not shown) thereby.

Figure 4:
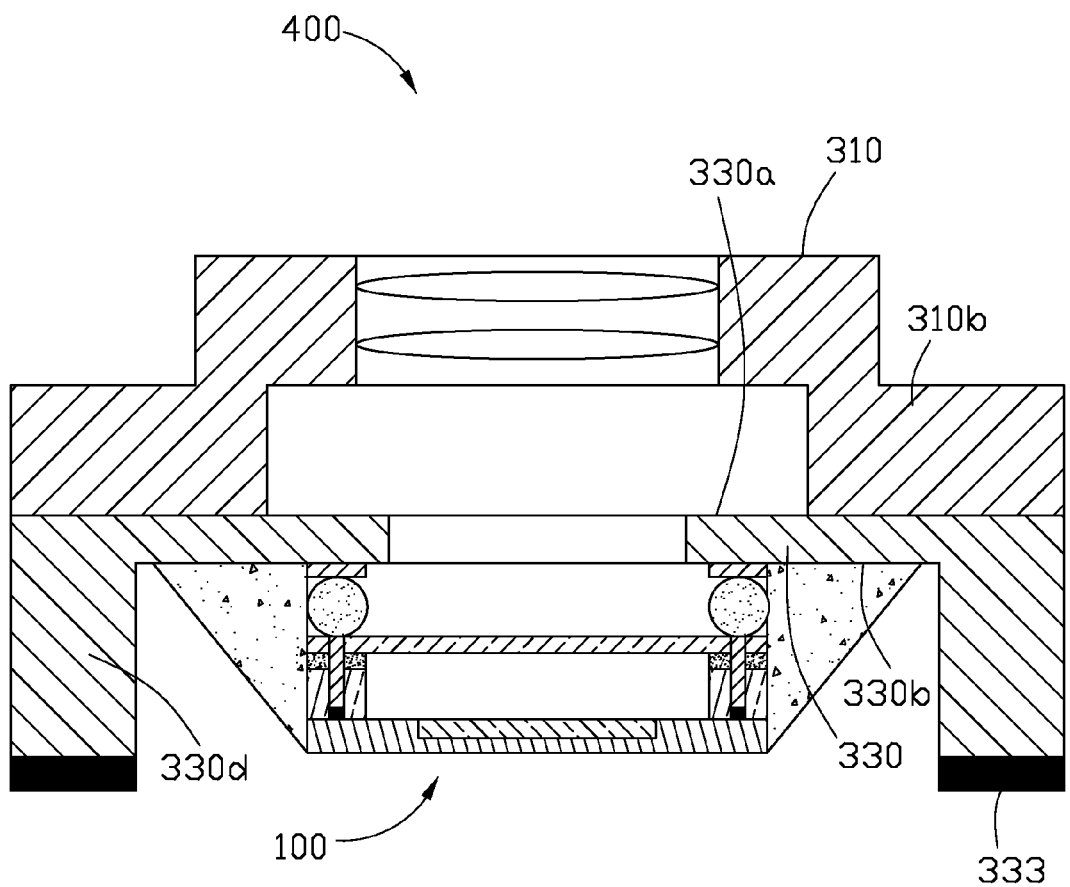
FIG. 4 is a schematic cross section of a camera module, according to a fourth exemplary embodiment.

Referring to FIG. 4, a camera module 400 in accordance with a fourth exemplary embodiment is disclosed, differing from the camera module 200 only in that a number of electrical patches 333 is formed on the circuitized board 330. In this embodiment, the circuitized board 330 is to the same size as the cross-section of the second hollow portion 310b. An annular flange 330d protrudes downwardly from the periphery of the second connecting surface 330b. A number of electrical patches 333 are formed on the bottom surface of the flange 330d. As a result, the camera module 400 can be mechanically and electrically coupled to external circuit(s) (not shown) via the electrical patches 333.

It will be understood that the above particular embodiments and methods are shown and described by way of illustration only. The principles and the features of the disclosure may be employed in various and numerous embodiment thereof without departing from the scope of the invention as claimed. The above-described embodiments illustrate the scope of the invention but do not restrict the scope of the invention.

What is claimed is:

1. An image sensor package comprising:
    an image sensor chip comprising: a photosensitive area, a non-photosensitive area surrounding the photosensitive area, and a plurality of bonding pads formed on the non-photosensitive area;
    a sidewall located on the non-photosensitive area and defining a plurality of first through holes aligned with and corresponding to the bonding pads;
    an encapsulation glass located on the sidewall; and
    a plurality of solder balls formed on the encapsulation glass aligned with the bonding pads, respectively, the encapsulation glass defining a plurality of second through holes each connecting a bonding pad and a corresponding solder ball, and the image sensor package further comprising a conductive material through which the first and second through holes penetrate.

2. The image sensor package as claimed in claim 1, wherein the encapsulation glass is an infrared cut filter.

3. The image sensor package as claimed in claim 1, wherein the sidewall is made from an insulative light-impervious material.

4. An camera module comprising:
    an image sensor chip comprising: a photosensitive area, a non-photosensitive area surrounding the photosensitive area, and a plurality of bonding pads formed on the non-photosensitive area;
    a sidewall located on the non-photosensitive area and defining a plurality of first through holes aligned with and corresponding to the bonding pads;
    an encapsulation glass located on the sidewall;
    a plurality of solder balls formed on the encapsulation glass aligned with the bonding pads, respectively, the encapsulation glass defining a plurality of second through holes each corresponding to a bonding pad and a corresponding solder ball, the camera module further comprising a conductive material through which the first and second through holes penetrate;
    a lens holder comprising a hollow first portion and a hollow second portion coaxially coupled thereto;
    a lens received in the hollow first portion of the lens holder;
    a circuitized board having a first connecting surface and a second surface facing away from the first connecting surface and defining an opening, formed with a plurality of first base pads on a surface thereof, wherein the lens holder is located on the opposite surface of the circuitized board with its optical axis aligning with the opening, and the base pad contacts the solder balls.

5. The camera module as claimed in claim 4, wherein the opening is larger than the photosensitive area.

6. The camera module as claimed in claim 4, wherein the circuitized board comprises a plurality of second base pads electrically coupling to an external circuit.

7. The camera module as claimed in claim 4, wherein a plurality of solder bumps are formed on an edge of the second surface, wherein the height of the solder bumps exceeds that of the camera module to mechanically and electrically couple to an external circuit thereby.

8. The camera module as claimed in claim 7, wherein a flange protrudes downwardly from the periphery of the second surface, a plurality of electric patches are respectively positioned on the bottom surface of the flange to mechanically and electrically couple to external circuits via the plurality of solder bumps.

9. The camera module as claimed in claim 4, wherein the encapsulation glass is an infrared cut filter configured for protecting the photosensitive area of the image sensor chip from staining and discourage light filtering.

10. The camera module as claimed in claim 4, wherein the sidewall is insulative light-impervious material.

11. A camera module comprising:
    an image sensor chip comprising: a photosensitive area, a non-photosensitive area surrounding the photosensitive area, and a plurality of bonding pads formed on the non-photosensitive area;
    a sidewall located on the non-photosensitive area and defining a plurality of first through holes aligned with and corresponding to the bonding pads;
    an encapsulation glass located on the sidewall;
    a plurality of solder balls formed on the encapsulation glass aligned with the bonding pads, respectively, the encapsulation glass defining a plurality of second through holes each corresponding to a bonding pad and a corresponding solder ball, the camera module further comprising a conductive material through which the first and second through holes penetrate;
    a lens holder comprising a hollow first portion and a hollow second portion coaxially coupled to the hollow first portion;
    a lens received in the hollow first portion of the lens holder;
    a circuitized board having a first connecting surface and a second surface facing away from the first connecting surface and defining an opening and formed with a plurality of first base pads on a surface thereof, the lens holder located on the opposite surface of the circuitized board with its optical axis aligned with the opening, and the base pad contacting the solder balls, respectively;
    an encapsulation epoxy located on the peripheral of the camera module to firmly fix the camera module to the second surface of the circuitized board.

12. The camera module as claimed in claim 11, wherein the opening is larger than the photosensitive area.

13. The camera module as claimed in claim 11, wherein a plurality of second base pads are formed on the first connecting surface, electrically coupling to external circuits.

14. The camera module as claimed in claim 11, wherein a plurality of solder bumps is formed on the edge of the second surface, the height of the solder bumps exceeding that of the camera module to mechanically and electrically couple to external circuits thereby.

15. The camera module as claimed in claim 14, wherein a flange protrudes downwardly from the periphery of the second surface, and a plurality of electric patches are respectively positioned on the bottom surface of the flange to mechanically and electrically couple to external circuits via the plurality of solder bumps.

16. The camera module as claimed in claim 11, wherein the encapsulation glass is an infrared cut filter configured for protecting the photosensitive area of the image sensor chip from being stained and filtering light.

17. The camera module as claimed in claim 1, wherein the sidewall comprises insulative light-impervious material.

* * * * *